United States Patent
Ngwendson et al.

(10) Patent No.: US 12,317,561 B2
(45) Date of Patent: May 27, 2025

(54) SIC MOSFET STRUCTURES WITH ASYMMETRIC TRENCH OXIDE

(71) Applicants: Dynex Semiconductor Limited, Lincolnshire (GB); Zhuzhou CRRC Times Semiconductor Co. Ltd., Hunan (CN)

(72) Inventors: Luther-King Ekonde Ngwendson, Lincolnshire (GB); Ian Deviny, Lincolnshire (GB); Yogesh Kumar Sharma, Lincolnshire (GB)

(73) Assignees: DYNEX SEMICONDUCTOR LIMITED, Lincolnshire (GB); ZHUZHOU CRRC TIMES SEMICONDUCTOR CO. LTD., Hunan (CN)

( * ) Notice: Subject to any disclaimer, the term of this patent is extended or adjusted under 35 U.S.C. 154(b) by 789 days.

(21) Appl. No.: 17/413,396

(22) PCT Filed: Jun. 18, 2020

(86) PCT No.: PCT/EP2020/066902
§ 371 (c)(1),
(2) Date: Jun. 11, 2021

(87) PCT Pub. No.: WO2021/254616
PCT Pub. Date: Dec. 23, 2021

(65) Prior Publication Data
US 2022/0320295 A1 Oct. 6, 2022

(51) Int. Cl.
*H01L 21/762* (2006.01)
*H10D 12/01* (2025.01)
(Continued)

(52) U.S. Cl.
CPC ....... *H10D 62/8325* (2025.01); *H10D 12/031* (2025.01); *H10D 30/611* (2025.01);
(Continued)

(58) Field of Classification Search
CPC ............. H10D 62/8325; H10D 12/031; H10D 30/611; H10D 30/668; H10D 64/516;
(Continued)

(56) References Cited

U.S. PATENT DOCUMENTS 6,140,678 A 10/2000 Grabowski et al.
6,180,958 B1 1/2001 Cooper
(Continued)

FOREIGN PATENT DOCUMENTS

| CN | 109037059 A | 12/2018 |
|---|---|---|
| DE | 10085054 B4 | 12/2005 |
| KR | 20000032754 A | 6/2000 |

OTHER PUBLICATIONS

International Search Report and Written Opinion dated Mar. 26, 2021 for corresponding International Application No. PCT/EP2020/066902.
(Continued)

*Primary Examiner* — Su C Kim
(74) *Attorney, Agent, or Firm* — Tarolli, Sundheim, Covell & Tummino LLP

(57) ABSTRACT

We herein describe a silicon-carbide (SiC) based power semiconductor device comprising: a drain region of a first conductivity type; a drift region of the first conductivity type disposed on the drain region, the drift region having a lower doping concentration compared to the doping concentration of the drain region; a body region of a second conductivity type, opposite to the first conductivity type, disposed over the drift region; a contact region of the first conductivity type, disposed within the body region; a source Ohmic
(Continued)

contact being disposed on the source region; and one or more trench gate regions being in contact with the source region, the body region and the drift region. Each of the one or more trench gate regions are configured to form a channel region in the body region between the source region and the drift region. At least one trench gate region comprises: two vertical sidewalls and a bottom surface between the two vertical sidewalls; and an insulation layer along the vertical side walls and the bottom surface. The insulation layer comprises different thicknesses such that the insulation layer is thinner at a portion of one of the vertical sidewalls including the channel region than at the other vertical side wall and the trench bottom.

6 Claims, 7 Drawing Sheets

(51) Int. Cl.
  H10D 30/60      (2025.01)
  H10D 30/66      (2025.01)
  H10D 62/832     (2025.01)
  H10D 64/27      (2025.01)
  H10D 84/00      (2025.01)
(52) U.S. Cl.
  CPC ......... H10D 30/668 (2025.01); H10D 64/516 (2025.01); H10D 84/144 (2025.01); H10D 84/146 (2025.01)
(58) Field of Classification Search
  CPC .............. H10D 84/144; H10D 84/146; H10D 30/0245; H10D 30/0229; H10D 62/142; H10D 64/518; H10D 84/955; A61K 40/422; H10F 39/1536; H10F 39/811
  See application file for complete search history.

(56) References Cited

U.S. PATENT DOCUMENTS

| | | | |
|---|---|---|---|
| 8,120,135 B2* | 2/2012 | Krischke | H01L 29/0653 |
| | | | 257/469 |
| 8,507,978 B2 | 8/2013 | Bhallaanup | |
| 8,748,976 B1 | 6/2014 | Kocon | |
| 2002/0094635 A1* | 7/2002 | Hirler | H01L 29/7813 |
| | | | 438/242 |
| 2002/0185680 A1 | 12/2002 | Henninger | |
| 2008/0135925 A1 | 6/2008 | Takemori | |
| 2010/0059816 A1* | 3/2010 | Shimada | H01L 29/42368 |
| | | | 257/334 |
| 2012/0037920 A1 | 2/2012 | Treu | |
| 2014/0027813 A1* | 1/2014 | Kuruc | H01L 29/4236 |
| | | | 257/E29.198 |
| 2017/0040423 A1* | 2/2017 | Inoue | H01L 29/7813 |
| 2020/0020798 A1 | 1/2020 | Eng | |
| 2020/0044076 A1 | 2/2020 | Siemieniec | |

OTHER PUBLICATIONS

Nakamura et al., "High performance SiC trench devices with ultra-low ron," 2011 International Electron Devices Meeting, 2011, pp. 26.5.1-26.5.3, doi: 10.1109/IEDM.2011.6131619.
"Trench-type SiC-MOSFET with Unique Electric-field-limiting Structure", International Conference on Silicon Carbide and Related Materials (2019) Mitsubishi Electric Corporation No. 3307, 4 pages.
Chinese Office Action dated Jul. 26, 2024 in Chinese Patent Application No. 202080007778.9.

* cited by examiner (a)

(b)

(c)

(d)

(e)

(f)

(g)

(h)

(i)

(j)

SIC MOSFET STRUCTURES WITH ASYMMETRIC TRENCH OXIDE

RELATED APPLICATIONS

The present application is a U.S. National Stage application under 35 USC 371 of PCT Application Serial No. PCT/EP2020/066902, filed on 18 Jun. 2020; the entirety of which is incorporated herein by reference.

FIELD

The present invention relates to a silicon carbide (SiC) based semiconductor device, particularly but not exclusively the present disclosure relates to a SiC based power metal oxide semiconductor field effect transistor (MOSFET).

BACKGROUND

Due to high electric field strength in SiC material, it is important to prevent premature breakdown, usually at the trench bottom and corners before the required maximum voltage is sustained.

US 2012/0037920 describes a SiC MOSFET with a deep p+ implant on one side of each trench and extending down to and underneath part of the trench bottom region. The extended deep p+ regions protect the thin gate oxide from high electric fields. However, creating very deep junctions in SiC with high-energy implants is expensive and creates defects in the device.

"*Trench-type SiC-MOSFET with Unique Electric-field-limiting Structure*", ISCRM 2019 proposes a combination of two p+ implants to create a grounded p+ region under the trench bottom in order to shield the thin gate oxide from high electric field. This uses multiple p+ implants, which increase device cost.

"*High Performance SiC Trench Device with Ultra-low Ron*", 2011 International Electron Devices Meeting, describes a double trench structure in which each active trench gate oxide is shielded from high electric fields by two adjacent grounded deep p+ trenches. This design is area inefficient.

Other silicon carbide based power devices can be found in U.S. Pat. Nos. 6,180,958, 8,748,976, and 8,507,978.

SUMMARY

According to one aspect of the present invention, there is provided a silicon-carbide (SiC) based power semiconductor device comprising:
 a drain region of a first conductivity type;
 a drift region of the first conductivity type disposed on the drain region, the drift region having a lower doping concentration compared to the doping concentration of the drain region;
 a body region of a second conductivity type, opposite to the first conductivity type, disposed over the drift region;
 a contact region of the first conductivity type, disposed within the body region;
 a source Ohmic contact being disposed on the source region; and
 one or more trench gate regions being in contact with the source region, the body region and the drift region, wherein each of the one or more trench gate regions are configured to form a channel region in the body region between the source region and the drift region, wherein at least one trench gate region comprises:
  two vertical sidewalls and a bottom surface between the two vertical sidewalls; and
  an insulation layer along the vertical side walls and the bottom surface, wherein the insulation layer comprises different thicknesses such that the insulation layer is thinner at a portion of one of the vertical sidewalls including the channel region than at the other vertical side wall and the trench bottom.

The contact region of the first conductivity type may have a higher doping concentration that the drift region of a first conductivity type and the body region of a second conductivity type.

In the trench gate region, the insulation layer along one vertical side wall may comprise different thicknesses and the insulation layer along another vertical side wall may comprise a constant thickness. Here the insulation layer of the gate trench region having different thicknesses generally means that a relatively thin insulation layer (or oxide) is present along the channel area and a relatively thick insulation layer (or oxide) is present along the remaining portion of the trench (e.g. near the bottom side walls and the along the bottom surface). In one example, the insulation layer along one side wall has both thin and thick layers and the insulation layer along another side wall has only a thick layer. In other words, this is an asymmetric trench oxide layer in the gate trench region. This is advantageous as this configuration allows a thick oxide layer where conduction channels or accumulation layers are not formed, but does not result in a thick oxide in regions where electron conduction channels are formed.

The gate trench regions may have a thick oxide layer or portion on vertical sidewall regions where conduction channels or accumulation layers are not formed. This reduces the gate to drain capacitance (Cgd) and improves the switching speed. This lowers or reduces the turn on energy loss ($E_{ON}$), the turn off energy loss ($E_{OFF}$), and the gate charge. The gate trench regions may not have a thin oxide layer on regions where electron conduction channels are formed. This improves the dynamic performance of the device.

Each vertical side wall of the trench gate may comprise an upper portion and a lower portion. A thickness of the insulation layer along the lower portion may be greater than a thickness of the insulation layer along the upper portion of one vertical side wall. For another vertical side wall, the thickness of the insulation layer along the lower portion and the upper portion may be the same. This configuration allows a thick oxide layer in regions where conduction channels are not formed, and a thin oxide layer in regions where there is no conduction channel.

The thickness of the insulation layer along the bottom surface of the trench gate may be the same as the thickness of the insulation layer along the lower portion of both vertical side walls.

The channel region may be formed along the insulation layer along the upper portion.

The vertical length of the lower portion may be greater than the vertical length of the upper portion.

The ratio of the vertical length of the lower portion and the vertical length of the upper portion may be equal to or greater than 1. This ratio may be adjusted to alter Cgd. In this way, the device performance can be adjusted.

The device may comprise a first gate trench region and a second gate trench region, and each of the first trench gate region and the second trench gate region may have a first sidewall and a second sidewall. The second sidewall of the first trench may be adjacent to the first sidewall of the second trench. The insulation layer along the second sidewall of the first trench and the first sidewall of the second trench may comprise a constant thickness, and the insulation layer along the first sidewall of the first trench and the second sidewall of the second trench may comprise different thicknesses. This provides a semiconductor device having gate trenches with a thin insulation layer in the channel region and a thick insulation layer outside the channel region.

The device may comprise at least two gate trench regions, and the device may comprise a contact region of a second conductivity type located within the body region and between two gate trench regions and having a higher doping concentration than the body region. The contact region of a second conductivity type may also be referred to as a p+ implant region. The p+ implant region may also be located adjacent and below the contact region of a first conductivity type and within the body region of a second conductivity type.

A first portion of the body region between two gate trench regions may extend to a bottom surface of the two trench gate regions. The first portion of the body region between two gate trench regions may extend below a bottom surface of the trench gate regions. In other words, the p+ implant may extend between adjacent trench side walls having a thick insulation layer. This offers the possibility of scaling the device rating to higher voltages such as 3.3 kV and above. Scaling to higher voltages is possible due to improved electric field relaxation offered by thick insulation layer in regions outside the conduction channel and thin insulation layer in the conduction channel in combination with the p+ implant.

The first portion of the body region may extend lower in the semiconductor device than a second portion of the body region. The second portion of the body region may be the region of the body region not between two adjacent gate trenches.

The channel region may be located in the second portion of the body region.

The device may comprise a Schottky contact. The Schottky contact may be located between adjacent trench gate regions of the one or more trench gate regions. The Schottky contact may be located between thick insulation layers of adjacent trench gate regions. The Schottky contact may be formed extending down from a surface of the semiconductor device. The device may comprise at least two gate trench regions and the Schottky contact may be located between the at least two trench gate regions. This forms an integrated Schottky diode in the SiC semiconductor device. This makes more efficient use of device area. The Schottky diode has lower on state voltage (VF) (approximately 1.7V) while the body diode of the MOSFET has a VF of approximately 3V. The body diode of a SiC MOSFET is prone to bipolar degradation, which compromises with the MOSFET reliability; therefore using an integrated Schottky diode reduces this.

The semiconductor device may be a vertical metal oxide semiconductor field effect transistor (MOSFET). The semiconductor device may be SiC based MOSFET with an integrated Schottky diode.

The SiC based semiconductor device may have an asymmetric trench gate oxide structure that has thick oxide on the trench bottom, one sidewall and only a portion of the second sidewall not used for conduction. In addition, a p-type implant may fill regions between adjacent trench side walls having thick oxide. This ensures that thin gate oxide regions of are not exposed to high electric field which is present across the device when sustaining voltage.

The semiconductor device ensures improved reliability: maximum voltage is reliably sustained due to the thick oxide layer on the trench bottom and two adjacent sidewalls not used for conduction. The semiconductor device has improved switching speed due to reduced gate to drain capacitance (Cgd). The asymmetric trench oxide improves BVdss*RonA trade-off due to reduced cell dimension. In MOSFET devices it is preferable to improve BVdss*RonA, wherein BVdss*RonA is the product of breakdown voltage (BVdss), the area(A) and the on-resistance(Ron) of the device.

The asymmetric trench oxide means that a very deep p+ implant may not be necessary, therefore, the semiconductor device is more cost effective. This is because for low voltage devices as the thick oxide on its own will be sufficient to manage the high electric field strength and the presence of the deep p+ implant may not be necessary. The semiconductor device has reduced cost, improved process yield, and improved device performance.

According to a further aspect of the present invention, there is provided a method of manufacturing a silicon-carbide (SiC) based power semiconductor device comprising one or more gate trench regions with an insulation layer, wherein the one or more trench gate regions with an insulation layer are manufactured using the steps of:

performing an etching process to form the one or more trenches;

forming a thick insulation layer on a lower surface and sidewalls of the one or more trenches;

depositing a hydrophilic layer over the thick insulation layer;

depositing a photoresist material in the one or more trenches, wherein depositing a photoresist material comprises exposing the hydrophilic layer on an upper region of a first side of the one or more trenches;

performing a wet etch process to etch the insulation layer on the sidewall of the first side of the one or more trenches to a predetermined distance below a surface of the photoresist material;

removing the photoresist material;

removing the hydrophilic layer;

growing a thin insulation layer on the sidewall of the first side of the one or more trenches, where-in the thin insulation layer is thinner than the thick insulation layer.

The presently disclosed method of manufacturing a semiconductor device includes a step of depositing a hydrophilic layer, such as nitride. The hydrophilic layer means that the etchant, in the later step of performing a wet etch, uses capillary action to etch the insulation layer on the sidewalls, below the surface of device. The capillary action etches down a channel between the hydrophilic layer and the material (silicon carbide) of the semiconductor device outside the trench. This also allows etching below the surface of the insulation layer, allowing deeper channels to be etched. Furthermore, this helps to achieve uniformity and consistency in both the etching process and the width and depth of the etched portion of the insulation layer. This also increases the controllability of the manufacturing process, in particular the width and depth of the etched portion.

The disclosed manufacturing process includes performing a wet etch that etches down a channel along the sidewall of the trench. This process facilitates the manufacture of devices having asymmetric trench gate regions, having two different insulation layer thicknesses on a sidewall of a trench.

The herein disclosed manufacturing process improves uniformity of channel etch depth and width, and therefore improves electrical performance uniformity from die to die. The disclosed process also has improved process control and yield. The disclosed process results in a reduced number of defects caused by instability of photoresist during wet etch down deep trenches, compared to state-of-the-art methods of manufacturing trenches.

The method may be used to manufacture insulated gate bipolar transistors (IGBTs), metal oxide semiconductor field-effect transistors (MOSFETs), MOS-Controlled Tyristors, or other semiconductor power devices.

The method may further comprise depositing a filling material after growing the thin insulation layer.

The hydrophilic layer may comprise nitride. The hydrophilic layer may comprise $Si_xN_y$ (silicon nitride) or another material with good wettability or a high degree of wetting. This improves the capillary action that etches down a channel. The wettability property of the hydrophilic layer allows accurate control of etch depth and ensures uniformity of the etch process down the etched channel.

The step of performing a wet etch may be carried out using a buffered oxide etch (BOE). The semiconductor device or wafer may be immersed in the BOE in order to etch the insulation layer along the exposed trench sidewalls.

Forming a thick insulation layer may comprise depositing a thick oxide layer. Forming a thick insulation layer may comprise thermally growing a thick oxide layer using a local oxidation of silicon process.

The thick insulation layer may have a thickness between 3000 Å and 5000 Å. The thin insulation layer may have a thickness between 500 Å to 2000 Å.

Before performing an etching process, the method may further comprise:
 forming a silicon carbide layer;
 forming a body region of a second conductivity type over the silicon carbide layer; and
 depositing a thin insulation layer over the body region. The thin insulation layer over the body region may have a thickness of 500 Å to 2000 Å.

The method may comprise manufacturing at least two gate trench regions each with an insulation layer, where a first gate trench region is separated from a second trench gate region and each of the first trench gate region and the second trench gate region may have a first side and a second side, and the second side of the first trench may be adjacent to the first side of the second trench. Depositing a photoresist material may comprise exposing the hydrophilic layer on the first side of the first trench gate region and the second side of the second trench gate region. Exposing the hydrophilic layer on the first side of the first trench gate region and the second side of the second trench gate region allows manufacture of a device having the insulation layer along the first sidewall of the first trench and the second sidewall of the second trench comprising different thicknesses, so that a thin insulation layer is formed in the channel region and a thick insulation layer is formed outside the channel region.

BRIEF DESCRIPTION OF THE FIGURES

Some preferred embodiments of the invention will now be described, by way of example only and with reference to the accompanying drawings, in which.

DETAILED DESCRIPTION OF THE PREFERRED EMBODIMENTS

Figure 1:
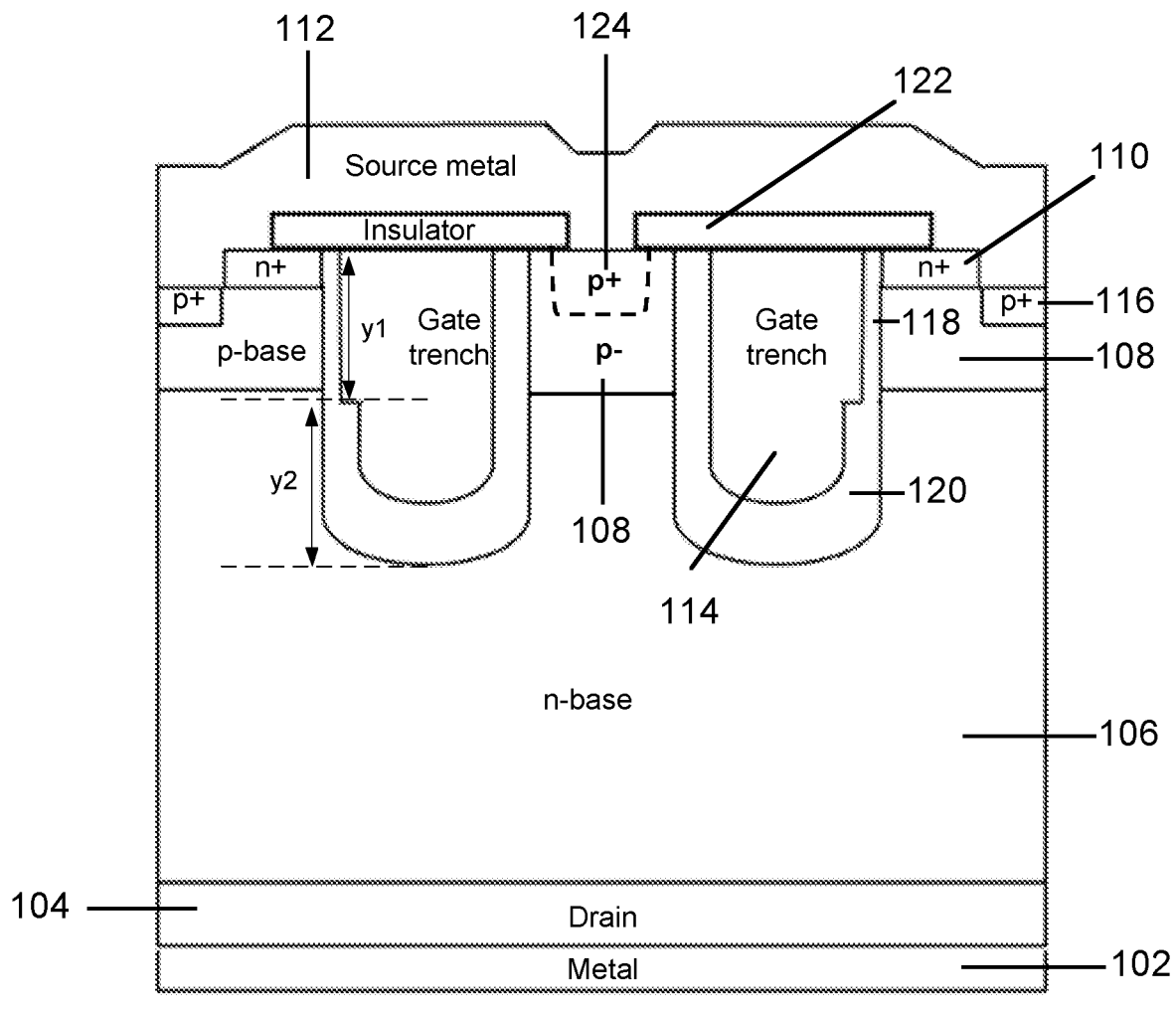
FIG. 1 illustrates a SiC based power MOSFET according to an embodiment.

FIG. 1 is a schematic cross-sectional view of a silicon carbide (SiC) based semiconductor device 100 with according to one embodiment. In this device, SiC based means that every region in the device apart from the metal (contacts), insulation, trench gate, and insulation (oxide) layers are formed from SiC. In this embodiment, the device 100 is an n-type voltage sustaining region or n-base (or a drift region) 106 over a drain 104 and a drain metal contact 102.

The device 100 includes two gate trenches 114 extending down into the n-base 106 from the surface of an n+ contact region 110. The device acts a MOSFET with a channel formed between the n+ contact region 110 and the drift region 106 in an on-state by application of a positive voltage. Within the n-base 106 and adjacent to the gate trench regions 114, there is provided a p-well or p-body (or a body region) 108. Within the p-base or p-body 108, the n+ contact region 110 of the source is formed.

In the embodiment of FIG. 1, two gate trenches 114 are formed, which are laterally spaced from each other. Each gate trench 114 includes vertical sidewalls and a bottom surface between the vertical sidewalls. The gate trenches 114 can be filled trenches with an oxide region on the side walls and a gate metal electrode within the trench. The trenches may be filled with a conducting material such as metal or doped polysilicon.

An emitter p+contact layer (or the second contact region) 116 is formed above the p-base (p-well layer) 108. The p+ contact layer 116 is located in a region below the n+ contact region 110.

The gate trenches 114 have an oxide layer having two thicknesses. One portion of the oxide layer has a greater thickness compared to another portion of the same oxide layer. The oxide layer with the greater thickness is referred to as a thick oxide layer 120 and the oxide layer of the same trench having a smaller thickness is referred to as a thin oxide layer 118. The same definitions apply to all the embodiments of the specification.

In this embodiment, the gate trenches 114 have two side walls. The conduction channel is formed along only one side wall and no conduction channel is formed along another side wall. The thin oxide layer 118 is generally located along the conduction channel region, which is located along the upper portion of one vertical side wall of each trench. The gate trenches 114 have a thick oxide layer or portion 120 on vertical sidewall regions where conduction channels or accumulation layers are not formed. The thick oxide layer 120 is generally located along the bottom surface, and the remaining vertical sidewall regions of the gate trenches 114. The gate trenches 114 have a thick oxide layer 120 (or an oxide layer having a constant thickness) along a complete vertical sidewall of the trench. The asymmetric oxide layer reduces the gate to drain capacitance (Cgd) and improves the switching speed. It also improves the BVdss RonA trade-off due to reduced cell dimension. Reduced cell dimensions leads to a greater number of cells in the chip, and hence the output current of the chip increases. By reducing the cell dimension the trenches will be closely spaced which results in improved shielding of the regions, which previously were subjected to high electric field, and therefore increases overall voltage blocking capability of the device.

The thick oxide layers 120 are formed by the local oxidation of silicon (LOCOS) technique. Generally, a thin oxide layer in the trench bottom can suffer from premature breakdown under high electric fields. The feature of trenches with a thick bottom oxide 120 improves immunity to high electric field stress, and allows a higher voltage to be sustained.

The gate trenches 114 may be formed of (or may have) an upper portion and a lower portion. The upper portion extends for a length y1 downwards from the surface of the trench. The lower portion extends for a length y2 upwards from the bottom of the trench. On trench sidewalls without a thick oxide layer on the upper portion, the transition from the thin oxide 118 to the thick oxide 120 on the vertical sidewalls of the trenches occurs at the boundary between the upper and lower portions. The transition occurs at a distance y1 from the top of the active trenches. The distance from the bottom of the active trenches to the transition from the thin oxide 118 to the thick oxide 120 is given by y2, in which generally y1/y2≥1 and adjusting this ratio alters the Cgd. In this way, y1 and y2 can be adjusted to tune the device performance. The values of y1 and y2 may vary for different trenches within the same device. y2 may be greater than 0.5 μm. y1 can be least as big as depth of the p-well 108.

The thick oxide layer 120 on the bottom surface of the gate trenches 114 increases the maximum voltage that can be sustained within the device, therefore improving reliability of the device 100. Having one trench sidewall with constant thickness 120 and one trench sidewall with thin oxide 118 in the conduction channel and thick oxide 120 on a lower portion reduces the cell dimension and there improves BVdss RonA trade-off.

An insulator, such as oxide, layer 122 is formed over the gate trench regions of the device not connected to the source metal contact 112.

A p+ implant 124 is formed between two adjacent gate trenches 114, in the mesa region between sidewalls of adjacent trenches having thick oxide. The asymmetric trench oxide means that a deep p+ implant may not be required.

Figure 2:
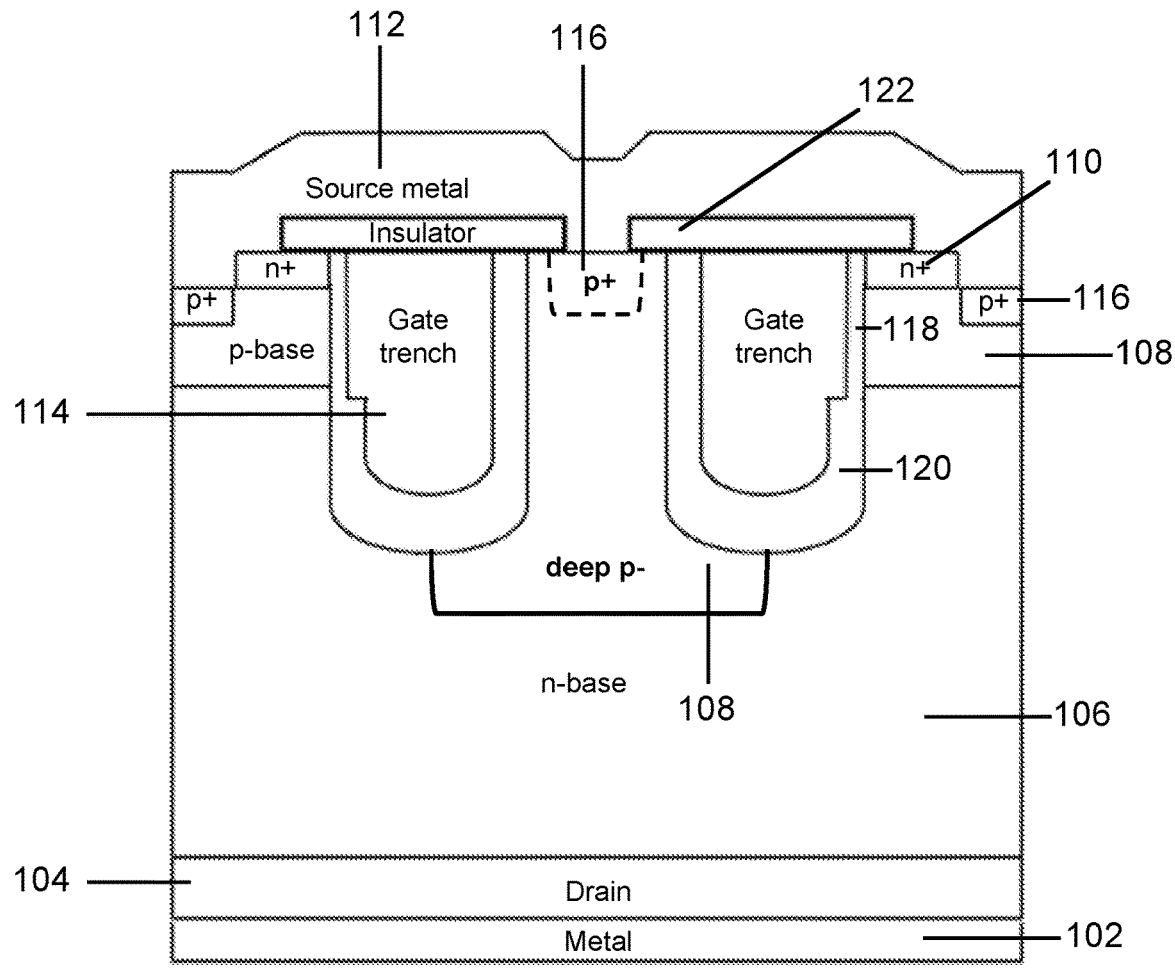
FIG. 2 illustrates an alternative SiC based power MOSFET according to a further embodiment.

FIG. 2 illustrates a schematic cross-sectional view of an alternative SiC based semiconductor device according to a further embodiment. In this embodiment, the p-body region 108 extends to the depth of the bottom of the gate trenches 114 of the device 100. This improves robustness of the device and scalability to higher voltages.

Figure 3:
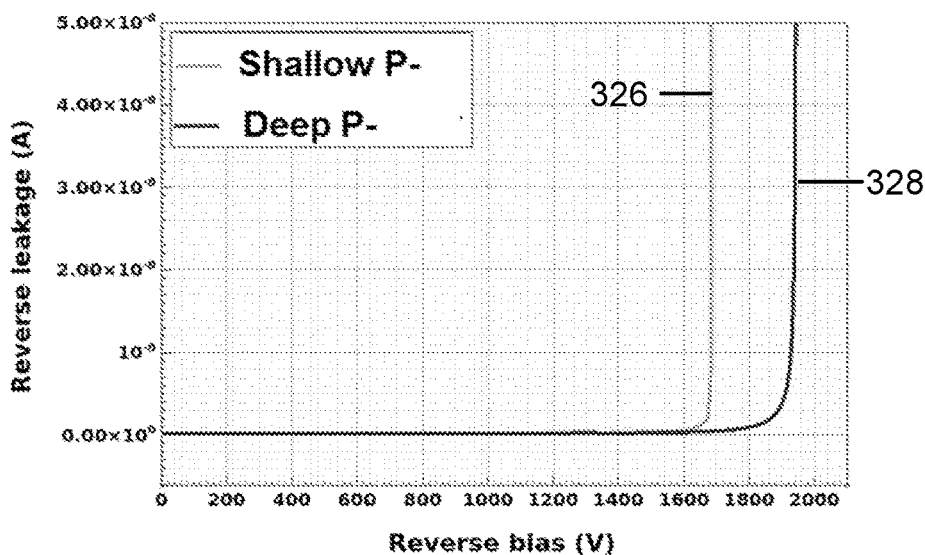
FIG. 3 shows performance of the power MOSFETs shown in FIG. 1 and FIG. 2.

FIG. 3 shows reverse conducting bias against reverse leakage for a semiconductor device with a shallow p-well 326 and a deep p-well 328. This shows that by having a deep p-well, the semiconductor device is able to sustain higher blocking voltage. The depth of the p-well can be altered to increase the chip rating e.g. from 1200V to 1700V, and up to 3300V.

Figure 4:
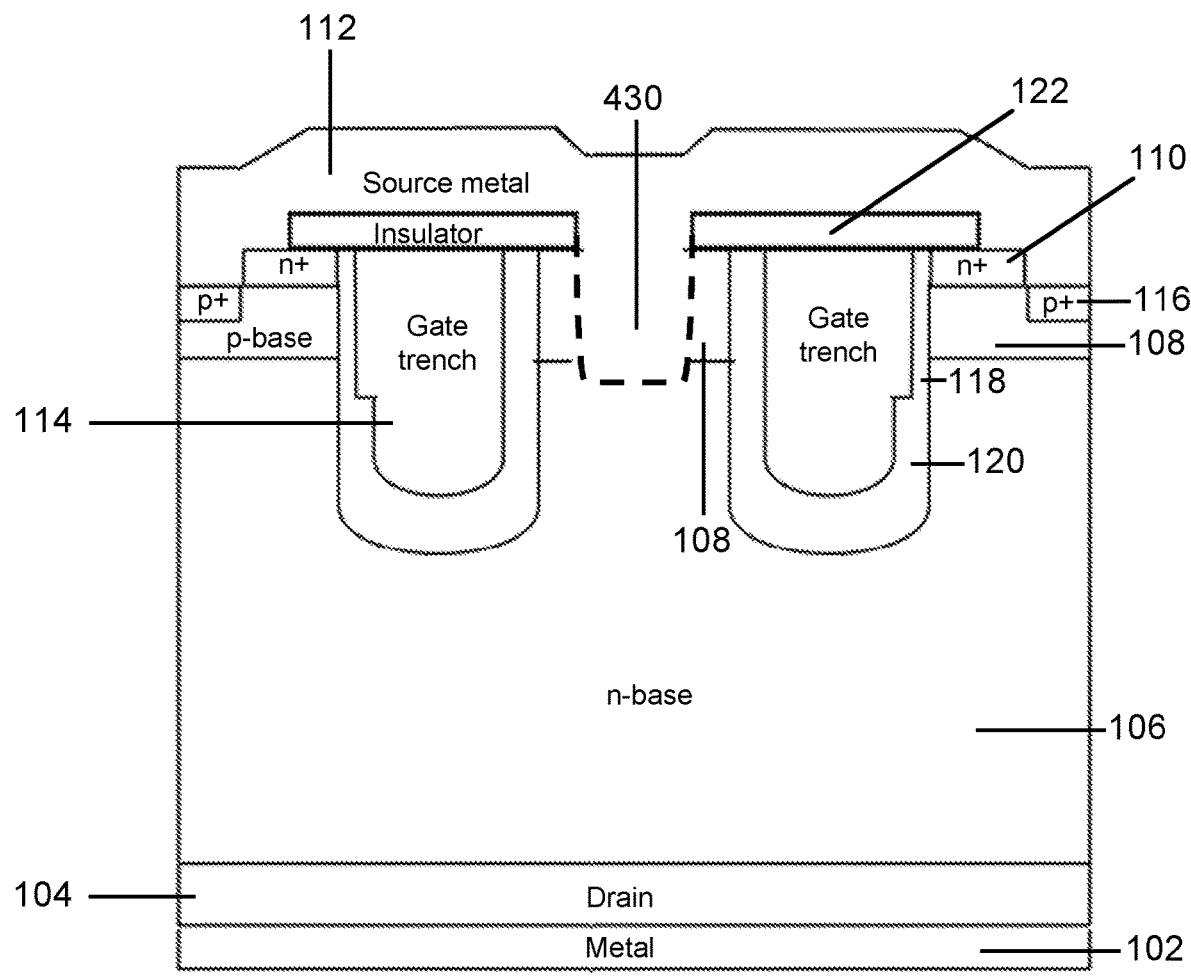
FIG. 4 illustrates an alternative SiC based power MOSFET according to a further embodiment.

FIG. 4 illustrates a schematic cross-sectional view of an alternative SiC based semiconductor device according to a further embodiment. In this embodiment, an integrated Schottky contact 430 is formed between the two gate trenches 114, and extends from the source metal contact 112 to the n-drift region 106. The integrated Schottky contact improves reliability. It also improves area efficiency of the device, ad reduces system cost as there is no requirement for Freewheeling diode (FWD). As a SIC Scottky diode is integrated in the area between the thick oxide trench region which is not used for MOSFET conduction, the device makes more efficient use of the SiC material to include two power devices in the same area, rather than just one. While building a power module a transistor is always accompanied by a complimentary Freewheeling diode (FWD). By including an integrated Schottky diode in the transistor (in this example, SiC MOSFET), a FWD is not required. This reduces the cost of the semiconductor modules.

Figure 5:
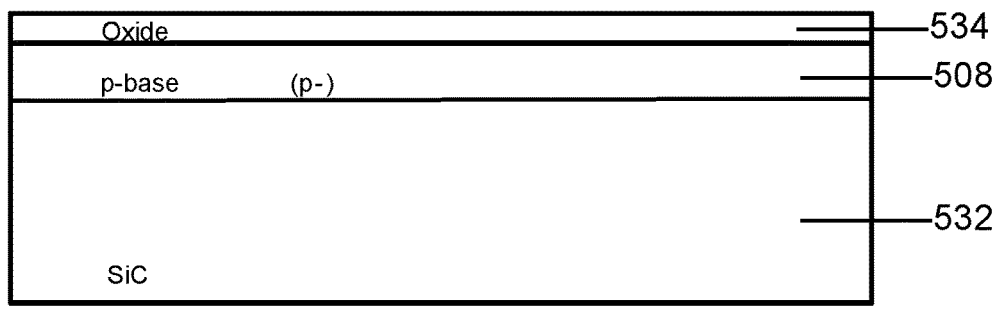
FIGS. 5(a) to 5(j) illustrate steps of a method of manufacturing a SiC based power MOSFET according to a further embodiment.
Figure 5:
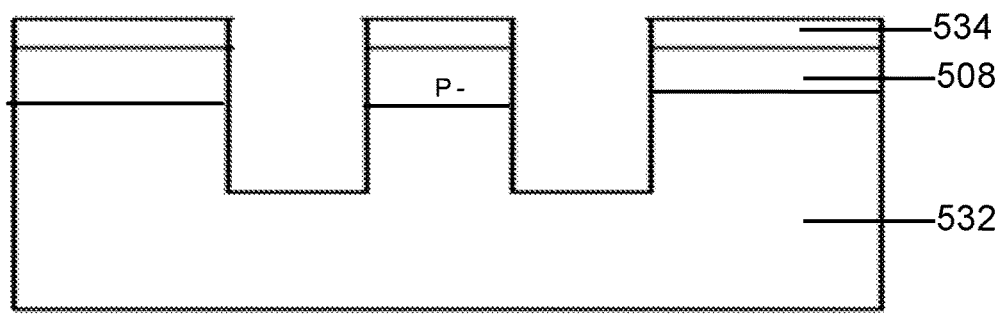
Figure 5:
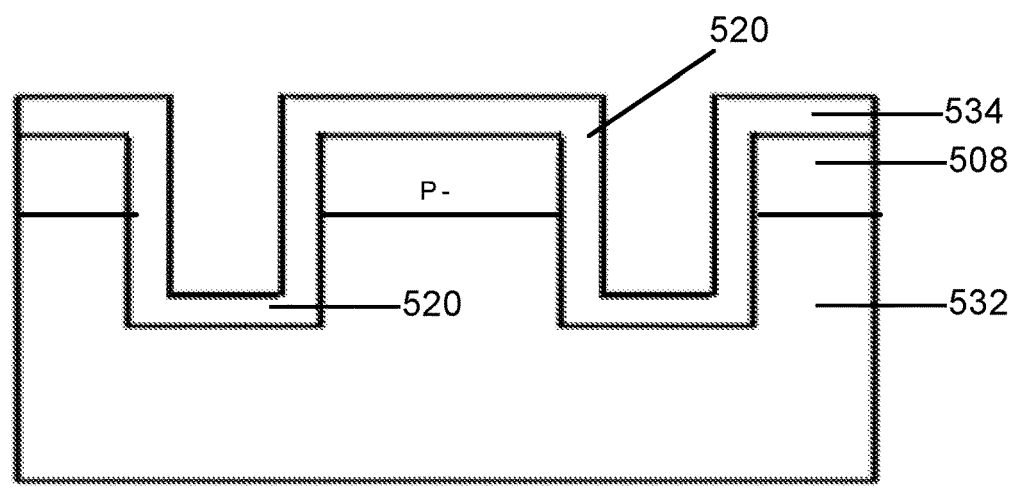
Figure 5:
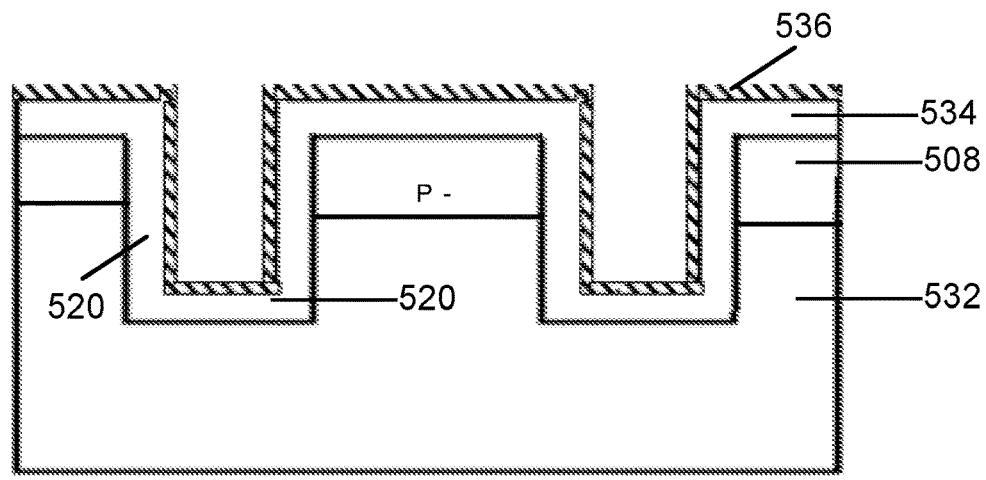
Figure 5:
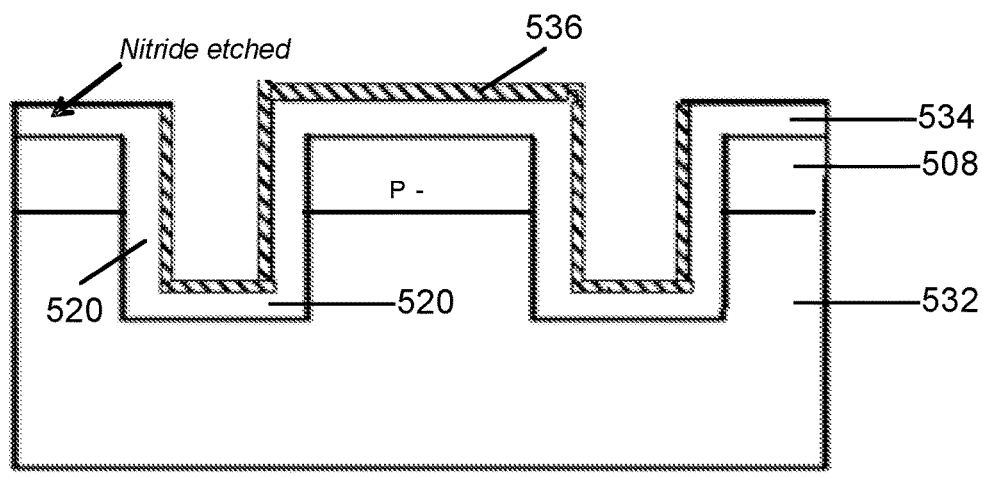
Figure 5:
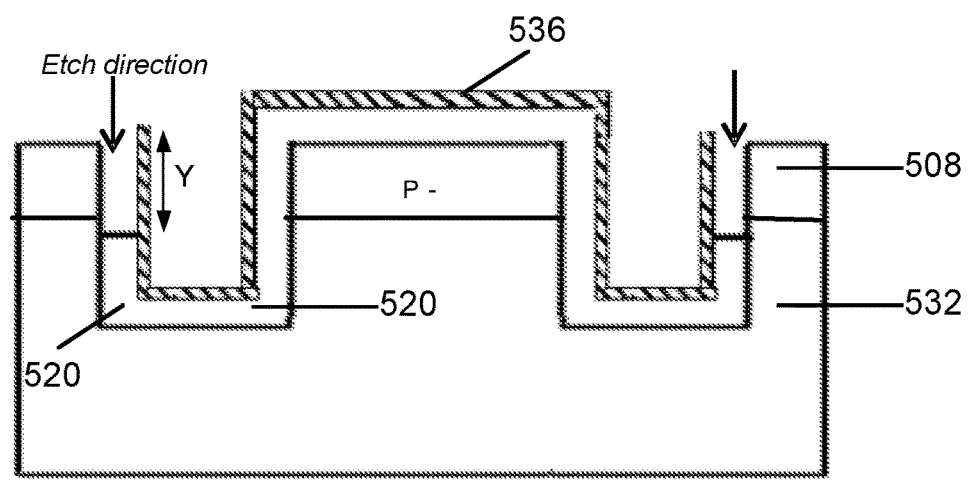
Figure 5:
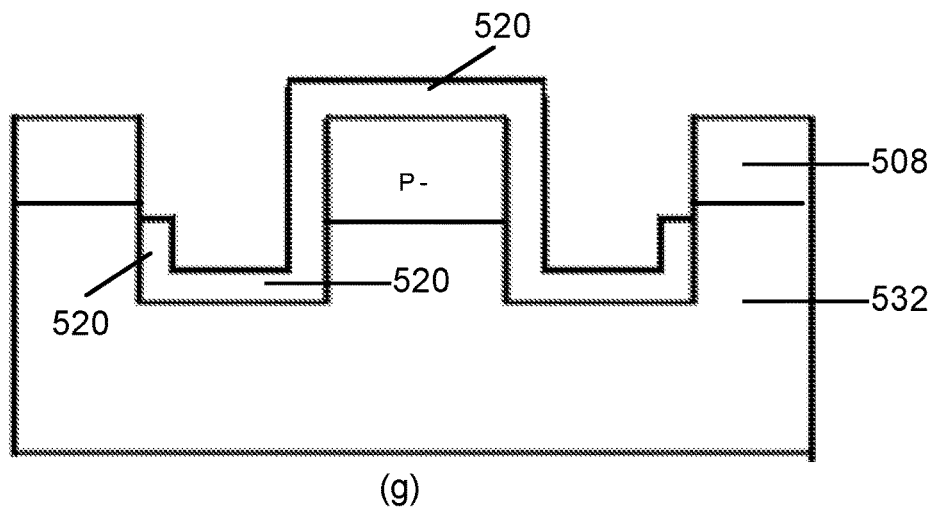
Figure 5:
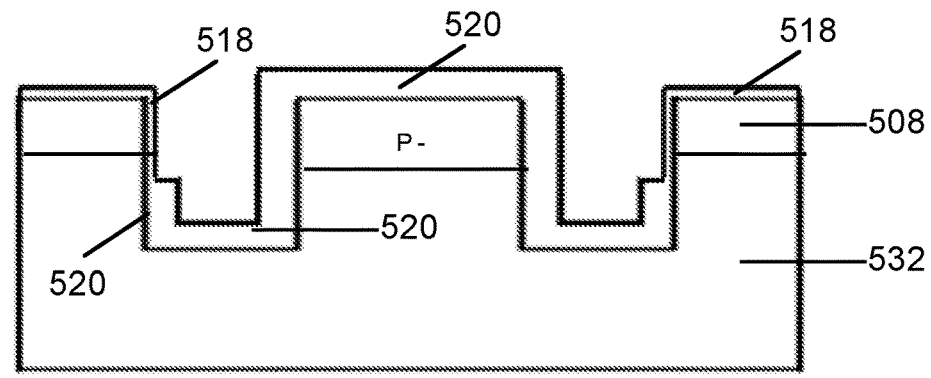
Figure 5:
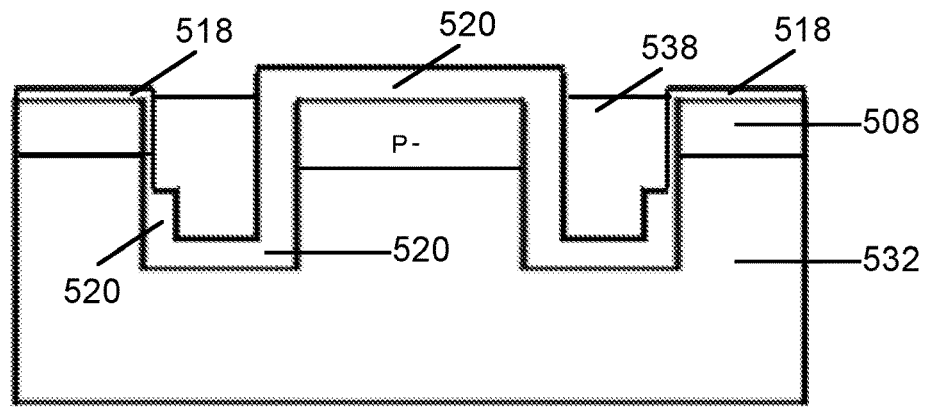
Figure 5:
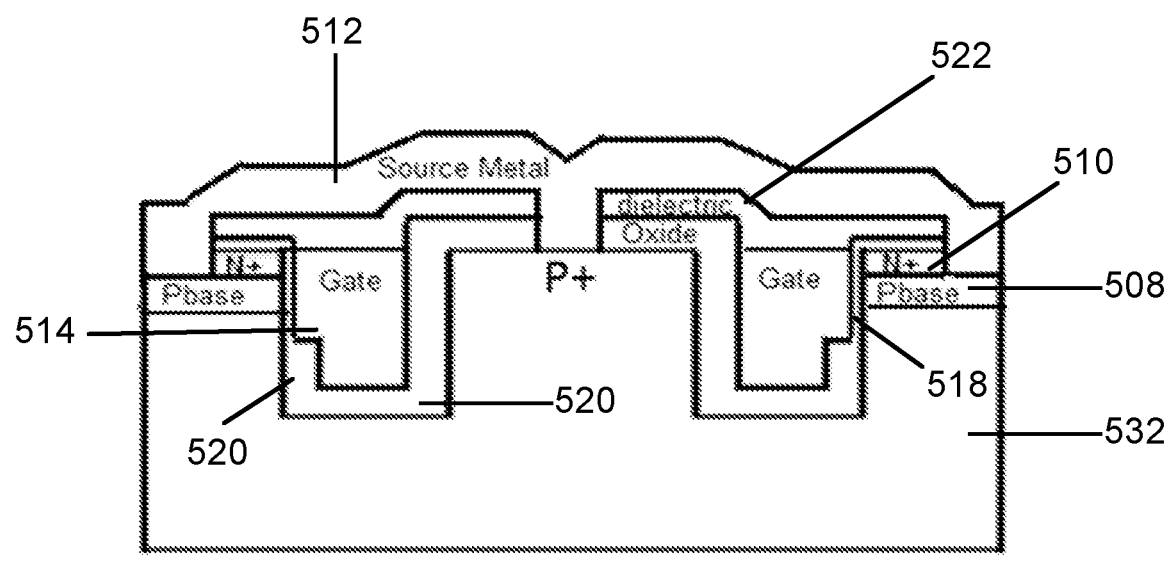

FIGS. 5(*a*) to 5(*j*) illustrate steps within a method of manufacturing a SiC based power MOSFET according to a further embodiment.

FIG. 5(*a*) illustrates the first step of manufacturing two trenches with asymmetric insulation layers, which is as follows:
(a) Step 1
A p-base layer is implanted and a thin oxide layer is deposited on a silicon carbide (SiC) substrate. The thin oxide layer has thickness of approximately 250 Å to 1800 Å.

FIG. 5(*b*) illustrates the second step of manufacturing two trenches, which is as follows:
(b) Step 2
Photolithography and then a dry etch step using plasma source to form trenches to desired depth z in the SiC substrate. In this embodiment, the desired depth z of the trenches is 1.0 μm to 6 μm.

FIG. 5(*c*) illustrates the third step of manufacturing two trenches, which is as follows:
(c) Step 3
A thick oxide layer is thermally grown or deposited on the sidewalls and bottom surface of the trenches. The thick oxide layer may be deposited using TEOS. The thick oxide layer has a thickness of approximately 3000 Å to 4000 Å.

FIG. 5(*d*) illustrates the fourth step of manufacturing two trenches, which is as follows:
(d) Step 4
A hydrophilic layer such as nitride is deposited over the oxide layer. The nitride layer has a thickness of approximately 500 Å to 2500 Å.

FIG. 5(*e*) illustrates the fifth step of manufacturing two trenches, which is as follows:
(e) Step 5
A mask is applied over the two trenches.
The mask is deposited such that the hydrophilic layer is exposed on a first side of a first trench and a second side of the second trench, where the first side and the second side are opposite sides. The mask covers the mesa region between the trenches the other sides of the trenches.
The first side of the first trench and the second side of the second trench (the sides where the hydrophilic layer is exposed) are the sides of the trenches that will be manufactured to have a thin oxide layer, whilst the sides of each trench that will be manufactured to have thick oxide remain covered by the photoresist.
The thickness of the photoresist is 1.0 μm to 1.5 μm for a 1.5 μm trench.
An etch process is performed on the exposed hydrophilic layer. The etch process can be a wet or dry etch, and stops on the thick oxide layer to expose a region of the oxide layer where the hydrophilic layer was exposed.

In embodiments where the hydrophilic layer is nitride, the etch process may be done in plasma ambient using CF4/HBr chemistry.

FIG. 5(f) illustrates the sixth step of manufacturing two trenches, which is as follows:

(f) Step 6

The whole wafer is immersed in a BOE (buffered oxide etch) such as 7:1 HF. The buffered oxide etchant etches the exposed region of the oxide layer on the trench sidewalls extending down from the surface of the exposed region to a desired depth Y below the surface of the trench.

The hydrophilic layer creates a capillary action so that the etchant etches the oxide layer along the narrow channel between the hydrophilic layer itself and the silicon carbide.

The presence of the hydrophilic layer allows control of the etch depth and uniformity of the etch process. The hydrophilic layer reduces defects formed during the etch process.

FIG. 5(g) illustrates the seventh step of manufacturing two trenches, which is as follows:

(g) Step 7

The photoresist is stripped (removed) using any suitable wet or dry chemistry.

The hydrophilic layer is stripped (removed) using any suitable wet or dry chemistry, i.e. any suitable mixture of a certain number of reactive gases. This leaves the trenches having only oxide on regions not exposed in Step 5.

FIG. 5(h) illustrates the eighth step of manufacturing two trenches, which is as follows:

(h) Step 8

A thin oxide layer is grown on the exposed silicon in a furnace step at 900° C. to 1100° C. The thin oxide layer grows on the side of each trench in which the hydrophilic layer was exposed in Step 5.

The thin oxide layer has thickness of approximately 250 Å to 1800 Å.

FIG. 5(i) illustrates the ninth step of manufacturing two trenches, which is as follows:

(i) Step 9

Doped polysilicon is deposited to fill the trenches. The polysilicon is planarised by etching the top of the polysilicon to level off the surface of the polysilicon.

FIG. 5(j) illustrates the tenth step of manufacturing two trenches, which is as follows:

(j) Step 10

An n+ source region is implanted. The n+ source region can be, for example, phosphorous, arsenic, or similar material A dielectric layer is formed over the trench gate regions. The dielectric layer can be, for example, oxide or nitride A source metal contact is formed over the device and in contact with the source region. The source metal material can be, for example, Al, Ni, or Ti.

The skilled person will understand that in the preceding description and appended claims, positional terms such as 'above', 'overlap', 'under', 'lateral', etc. are made with reference to conceptual illustrations of an apparatus, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

It will be appreciated that all doping polarities mentioned above could be reversed, the resulting devices still being in accordance with embodiments of the present invention.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in the disclosure, whether alone or in any appropriate combination with any other feature disclosed or illustrated herein.

LIST OF REFERENCE NUMERALS USED

100—MOSFET device
102—drain contact metal
104—drain region
106—drift region
108—body region
110—source region
112—source contact
114—gate trench region
116—p+ region
118—thin insulation layer
120—thick insulation layer
122—insulator
124—p+ implant
326—shallow p−
328—deep p−
430—Schottky contact
508—p-body region
510—source region
512—Source metal contact
514—gate trench
518—thin oxide layer
520—thick oxide layer
522—insulation layer
532—SiC substrate
534—oxide layer
536—hydrophilic layer
538—doped polysilicon

The invention claimed is:

1. A method of manufacturing a silicon-carbide (SiC) based power semiconductor device comprising one or more gate trench regions with an insulation layer, wherein the one or more trench gate regions with an insulation layer are manufactured using the steps of:
performing an etching process to form the one or more trenches;
forming a thick insulation layer on a lower surface and sidewalls of the one or more trenches;
depositing a hydrophilic layer over the thick insulation layer;
depositing a photoresist material in the one or more trenches, wherein depositing a photoresist material comprises exposing the hydrophilic layer on an upper region of only a first side of the one or more trenches;
performing a wet etch process to etch the insulation layer on the sidewall of only the first side of the one or more trenches to a predetermined distance below a surface of the photoresist material;
removing the photoresist material;
removing the hydrophilic layer;

growing a thin insulation layer on the sidewall of only the first side of the one or more trenches, wherein the thin insulation layer is thinner than the thick insulation layer.

2. A method according to claim 1, wherein the method further comprises depositing a filling material after growing the thin insulation layer.

3. A method according to claim 1, wherein the hydrophilic layer comprises nitride; or wherein forming a thick insulation layer comprises depositing a thick oxide layer.

4. A method according to claim 1, wherein the thick insulation layer has a thickness between 3000 Å and 5000 Å; or wherein the thin insulation layer has a thickness between 500 Å to 2000 Å.

5. A method according to claim 1, wherein before performing an etching process, the method further comprises:
   forming a silicon carbide layer;
   forming a body region of a second conductivity type over the silicon carbide layer; and
   depositing a thick insulation layer over the body region.

6. A method according claim 1, wherein the method comprises manufacturing at least two gate trench regions each with an insulation layer, wherein a first gate trench region is separated from a second trench gate region; and
   wherein each of the first trench gate region and the second trench gate region have a first side and a second side and wherein the second side of the first trench is adjacent to the first side of the second trench; and
   wherein depositing a photoresist material comprises exposing the hydrophilic layer on the first side of the first trench gate region and the second side of the second trench gate region.

* * * * *